LOGIC GATE HAVING A VARIABLE SWITCHING THRESHOLD

Filed Nov. 30, 1965

INVENTORS
RICHARD A. GISSEL,
WALTER C. SEELBACH &
PHILIP B. FOSTER.

BY Mueller Aichele and Rauner
ATTYS.

United States Patent Office
3,445,680
Patented May 20, 1969

3,445,680

LOGIC GATE HAVING A VARIABLE SWITCHING THRESHOLD

Philip B. Foster, Phoenix, Richard A. Gissel, Tempe, and Walter C. Seelbach, Scottsdale, Ariz., assignors to Motorola, Inc., Franklin Park, Ill., a corporation of Illinois Filed Nov. 30, 1965, Ser. No. 510,506
Int. Cl. H03k *19/34, 19/36*
U.S. Cl. 307—215 10 Claims

ABSTRACT OF THE DISCLOSURE

A logic gate having a variable switching threshold and including input and output semiconductor devices interconnected by a voltage offset impedance which establishes the switching threshold for the output semiconductor device. Variable bias circuitry and an adjustable current source is connected to the offset impedance, and by varying the current level in the current source, the voltage drop across the offset impedance is established. This voltage drop determines the switching threshold of the output device in response to a plurality of binary input signals coupled to the input semiconductor device.

The present invention relates generally to logic gates and more particularly to a variable threshold logic gate with improved noise immunity characteristics.

Electronic logic gating circuits frequently are used in applications where the noise level is high, and where noise signals are likely to be conducted through a variety of paths (direct pickups, capacitive coupling, inductive cross-talk, ground line noise, etc.) to the gating circuit and cause the electronic equipment in which the gating circuit is used to malfunction. Various attempts have been made to prevent application of these noise signals to electronic gating circuits by using sophisticated shielding devices. These devices are, however, often bulky, expensive and far less than 100% effective in keeping noise out.

An object of the present invention is to provide a logic gate that is insensitive to surrounding noise signals.

Another object of the invention is to provide a logic gate having a variable noise level to which the gate is insensitive.

Another object of the invention is to provide a logic gate which is relatively insensitive to temperature variations.

A feature of the invention is the provision of a logic gate in which an input transistor is connected to receive input switching signals from a diode gating circuit and is connected at the output thereof to a constant current source. The constant current source may be variably biased to control the current flow in the input transistor when the input transistor is switched by the gating circuit. By controlling the voltage drop across an offset resistor connected between the input transistor and the constant current source (by varying the bias on the constant source transistor), a variable threshold voltage level is available at the input of an output inverter transistor connected to the offset resistor.

Another feature of the invention is the provision of a protection diode connected between the junction of the output transistor and the constant current source transistor and a point of reference potential. This diode prevents saturation of the constant current source and prevents voltage breakdown at the output invertor.

Another feature of the invention is the provision of a variable bias network connected to the constant current source transistor for setting the level of current flow in the input transistor.

Another feature of the invention is the provision of mutually offsetting temperature compensation between the input gating circuit and the input transistor and between the constant current source transistor and the output invertor transistor.

Another feature of the invention is the provision of a protection diode from the output (collector) electrode of the current source transistor and a substrate formed on the monolithic chip carrying the above named transistors thereby eliminating the need for a separate protection diode and the need for an additional isolation area in said chip.

Another feature of the invention is the provision of a variable threshold logic gate of the type described adapted to form an integral section of either a set-reset integrated flip-flop circuit or an integrated line driver circuit thereby imparting the novelty of variable threshold gating to each of these circuits.

The invention to be described is illustrated in the accompanying drawings wherein.

Figures 1, 2, 3, 4:
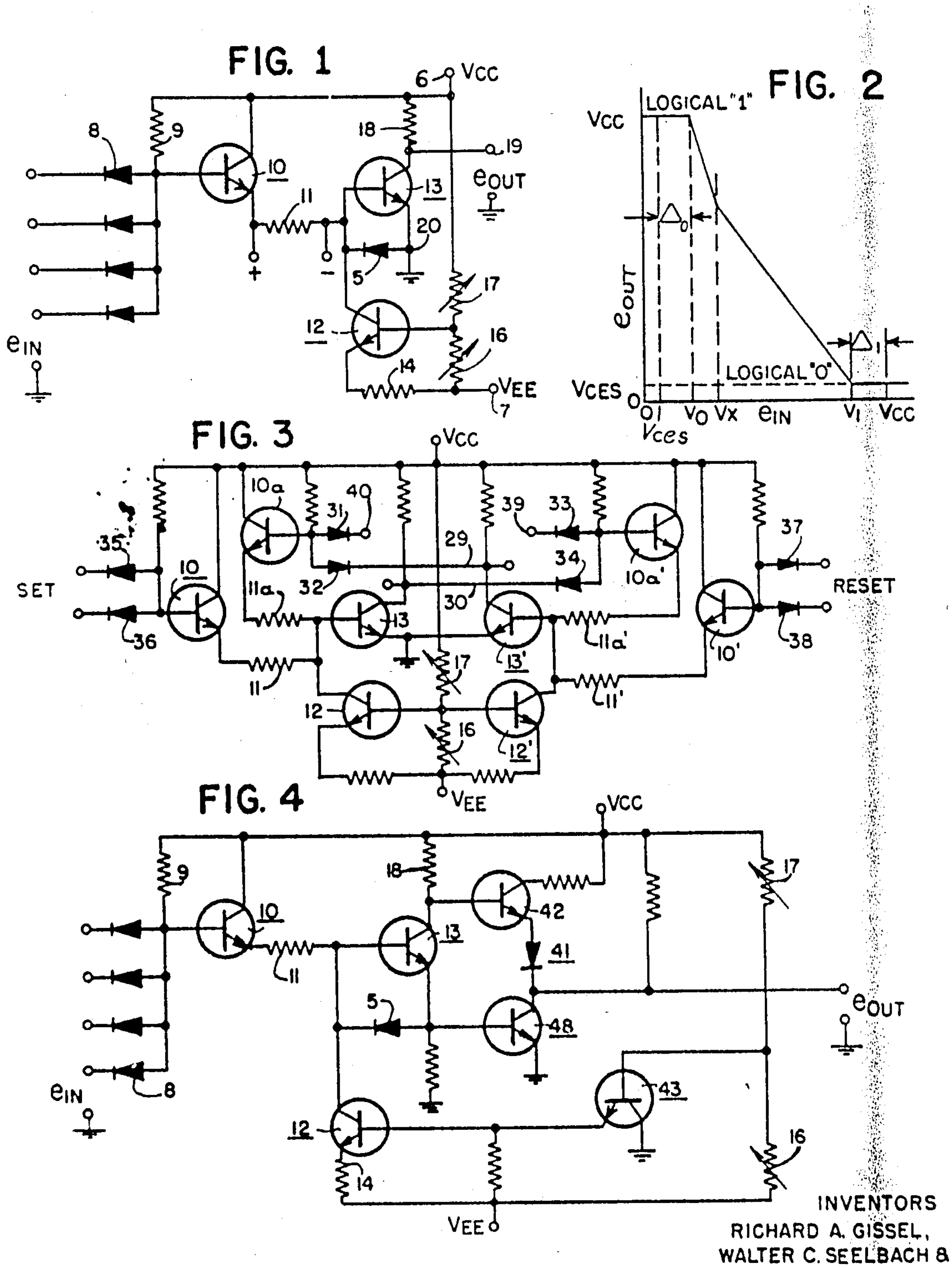
FIG. 1 is the basic logic gate according to the present invention.
FIG. 2 is a graph of a transfer characteristic of the circuit of FIG. 1.
FIG. 3 is a set-reset flip-flop employing the threshold gating control principle of FIG. 1.
FIG. 4 is a line driver circuit, also employing the principle of FIG. 1, and having a low output impedance for driving capacitive loads.

Briefly described the invention includes, in combination, an input transistor which normally draws a small current and a diode gate connected to said input transistor and adapted to switch said input transistor into heavy conduction when input signals at the gate reach a predetermined level. A constant current source transistor is coupled through a voltage dropping resistor to the output electrode of the input transistor and establishes, via a variable biasing network connected thereto, the current drawn by the input transistor. An output invertor is connected to one end of the voltage dropping resistor and is driven into conduction when the voltage at said one end of the voltage dropping resistor reaches a predetermined threshold level. This threshold level is controlled by the amount of current drawn by the input transistor.

Referring in detail to the drawings, there is shown in FIG. 1 a variable threshold logic gate including NPN input transistor device 10 connected to a first voltage supply terminal 6 and biased via resistor 9 to draw a very small current in the absence of switching signals applied thereto. The control electrode of the transistor 10 is connected to four identical diode gates 8 in a NAND logic switching arrangement.

The output electrode of the input transistor 10 is connected through offset voltage dropping resistor 11 to a junction point between the control electrode of the output inverter 13 and the output electrode of the constant current source 12. A protection diode 5 has its cathode formed from the collector or output electrode of the constant current source transistor device 12 and its anode formed from the P-type substrate of a monolithic chip upon which the entire semiconductor arrangement forming the logic gate is mounted. This P-type substrate is connected to a point 20 of reference potential.

The constant current source is biased into conduction via resistors 14, 16 and 17, the latter of which are connected between positive and negative voltage supply terminals 6 and 7 in a voltage divider arrangement.

CIRCUIT OPERATION

In operation, $V_{EE}$ and $V_{CC}$ provide a constant current flow through transistor 12 and this current may be varied by either varying the supply voltages at terminal 6 or 7 or by varying the values of resistances 14, 16 and 17. When the forward bias on transistor 12 emitter-base junction is increased, the current drawn from input transistor 10 and the voltage drop across resistor 11 are likewise increased.

The diode 5 is necessary to prevent the constant current source transistor 12 from saturating during high logic swings and to limit the amount of reverse bias on the inverter 13 base-emitter junction. Otherwise, this junction may breakdown when operating with high logic swings. The diode 5, as previously mentioned, is a collector-substrate diode, using the collector of transistor 12. By connecting the P-type substrate to ground, the collector-substrate diode is used as a circuit element thereby eliminating the necessity for any additional diode and isolation area on the monolithic chip.

When all four inputs at the cathodes of input diodes 8 are at a certain predeterminted level, the input transistor 10 is driven into heavy conduction and current will flow in offset resistor 11. Since the current flowing in transistor 12 must remain constant, an increase in current flowing in resistor 11 will be accompanied by a decrease in current flowing in diode 5 as the gate input levels become more positive. When the input reaches a certain predetermined level, diode 5 comes out of clamp completely and transistor 12 current flows entirely through the offset voltage dropping resistor 11. If the input voltage continues to rise, the base voltage of the output inverter 13 will also rise. When the base-emitter threshold voltage for output invertor 13 is reached, the invertor is driven into conduction.

The variable threshold logic circuit of FIG. 1 is designed to keep the input threshold level relatively insensitive to the temperature variation. The input diodes are temperature compensated for by the oppositely poled base-emitter junction of the input emitter follower 10, and the base-emitter of the inverter 13 is temperature compensated by the oppositely poled base-emitter of the constant current source transistor 12. Since the temperature tracking ratio of resistors on a monolithic chip can be held to close tolerance limits, temperature changes produce only slight variations in the voltage at the base of the current source transistor 12. If, however, resistor 11 is made equal to resistor 14, the threshold voltage level at inverter 13 will be substantially insensitive to temperature since all diodes in the circuit are temperature compensated.

To understand fully the noise rejection capabilities of the variable threshold logic gate, it is necessary to examine the voltage transfer characteristics of the gate in FIG. 1. FIG. 2 shows a voltage transfer characteristic $E_{in}$ versus $E_{out}$ of the gate in FIG. 1. As the input voltage is increased in a positive direction, the first breakpoint occurs when the output invertor begins to conduct. This point is defined as $V_0$. As the input voltage is further increased to $V_X$, the output load gate diodes (not shown) connected to the output terminal 19 in FIG. 1 begin to conduct, thereby decreasing the voltage gain of the gate. The last breakpoint occurs when the input voltage reaches $V_1$, and at this point the output invertor 13 goes into hard saturation.

From the transfer characteristic curve in FIG. 2, the input logical "0" DC noise margin, $\Delta_0$, is equal to the difference between $V_0$ and the low level voltage at the input transistor 10, $V_{ces}$. The input logical "1" DC noise margin, $\Delta_1$, is equal to the difference between the high level input $V_{CC}$ and $V_1$, the input voltage at which the inverter 13 starts to come out of saturation.

For the output voltage to be substantially equal to half power supply voltage, $V_{CC}/2$, when the input voltage equals $V_{CC}/2$, $V_0$ should be chosen nominally to be less than $V_{CC}/2$ to compensate for the finite slope of the transfer characteristic while the output inverter 13 is in the active region (voltage-gain region of the gate). However, $V_0$ should be selected high enough to insure that the minimum DC noise margins with respect to the logical 1 and 0 levels are essentially under worse case conditions.

Another circuit employing the variable threshold logic principle is shown in FIG. 3 and includes a symmetrically coupled flip-flop comprised of input transistors 10, 10', current source transistors 12, 12', and output inverter transistors 13, 13'. Also included in the circuit of FIG. 3 is an additional pair of input transistors 10A, 10A' which are connected in the set and reset input circuit in parallel with the transistor 10, 10' to provide additional capacity for DC set and reset input voltages. In addition, these transistors 10A, 10A' are cross-coupled via diodes 32 and 34 to the output electrodes of inverter transistors 13', 13 respectively to provide DC bistable switching for the flip-flop. The set and reset terminals 35, 36, and 37, 38 at the inputs of transistors 10 and 10' respectively provide means for applying AC set and reset signals to the flip-flop circuit and terminals 39, 40 provide means for applying DC set and reset signals.

The biasing resistors 16 and 17 and the voltage dropping resistors 11, 11' and 11A and 11A' are connected with respect to the input transistors in a manner similar to the offset resistor 11 connected in FIG. 1. The arrangement in FIG. 3 involves the same variable threshold principle as that discussed with reference to FIG. 1.

The circuit in FIG. 4 is a line driver and also employes the variable threshold gating principle. The line driver of FIG. 4 is used for driving capacitive loads and is provided with a low impedance output including series connected transistors 42 and 48 at the output of transistor 13. The output circuit arrangement of FIG. 4 provides a low output impedance at all times during the conduction of transistor 13. This low output impedance is desirable when the line driver is used to drive high capacitance loads (in the range of 200 or 300 picofarads) in order to provide a low time constant in the output and a relatively fast switching time.

The transistor 43 which has been added as a second constant current source between the biasing arrangement 16, 17 and transistor 12, provides temperature compensation for the additional transistors 42, 48 and diode 41 in the output of invertor 13.

The invention described above provides a high inherent noise immunity as well as noise immunity which may be varied according to the needs of the equipment with which the variable threshold logic gate is associated. Simply by choosing the proper values of power supply voltages $V_{CC}$ and $V_{EE}$ or bias resistors for the constant current source system designers can vary the triggering threshold voltage for the output invertor, thereby optimising the equipment design for any specific application. Additionally, by varying the ratio of the bias supply of voltages $V_{CC}$ and $V_{EE}$, the designer may discriminate somewhat between various types of noise rejection. For example, an imbalance of 20% in supply voltages can gain up to half a volt of ground noise immunity, only at the expense of the input noise rejection symmetry.

The improved noise immunity features of the present invention obviously increase the power dissipation in the circuit. At the same time, however, circuit switching speed is increased since speed is directly related to power dissipation.

An additional novel feature of the variable threshold logic gate is that logic threshold is virtually uneffected by varying operating temperatures over a range of 0 to 75°

C. This is in sharp contrast with other logic designs, operating points of which are significantly altered by temperature changes.

We claim:

1. A variable threshold logic gate including in combination:

(a) an input semiconductor device connected to a first voltage supply terminal, (b) input gate circuit means connected to said input semiconductor device and adapted to receive logic signals for biasing said input semiconductor device into conduction when said input logic signals reach a predetermined level, (c) a current source connected to said input semiconductor device and to a second voltage supply terminal, said current source biased to draw current from said input semiconductor device when said input semiconductor device is conducting, (d) an output semiconductor device connected between said current source and said first voltage supply terminal, (e) a voltage dropping offset impedance connected between said input semiconductor device and said output semiconductor device and establishing the threshold level at which said output semiconductor device will be biased to conduction upon receipt of binary logic signals at said input gate circuit means above a predetermined logical level, and (f) adjustable bias means connected to said current source for varying the current flow therethrough in order to vary the current flow through said voltage dropping offset impedance and control the threshold level at which said output semiconductor device is biased into conduction.

2. The gate circuit defined in claim 1 wherein said adjustable bias means includes an adjustable voltage divider network connected between said first and second voltage supply terminals and connected to said current source for establishing the operating bias for said current source in accordance with the desired voltage drop across said offset impedance.

3. The gate circuit according to claim 1 which further includes a protection diode connected at one electrode thereof to a common junction between said output semiconductor device and said current source and connected at the other electrode to a point of reference potential for preventing said current source from saturating and for protecting said output semiconductor device for voltage breakdown.

4. The gate circuit according to claim 1 wherein:

(a) said input semiconductor device, said output semiconductor device, and said current source are transistors each having input, output and control electrodes, (b) a first bias resistor connected between said input and control electrodes of said input transistor and to said first voltage supply terminal, (c) a second bias resistor connected between said input electrode of said current source and said second voltage supply terminal, (d) an output load resistor connected between the output electrode of said output transistor and said first voltage supply terminal, (e) said input gate circuit means being poled opposite to the output and control electrodes of said input transistor to provide mutual offsetting temperature compensation therebetween, and (f) said input and control electrodes of said current source transistor and said output transistor respectively being oppositely poled to provide mutual offsetting temperature compensation between said output and current source transistors.

5. The gate according to claim 1 wherein:

(a) said current source is biased to draw constant current, said gate further includes, (b) a protection diode connected at one electroae thereof to a common junction between said output semiconductor device and said current source and connected at the other electrode thereof to a point of reference potential for preventing said current source from saturating and for protecting said output semiconductor device from voltage breakdown.

6. A gate circuit according to claim 5 wherein:

(a) said input semiconductor device, said output semiconductor device and said constant current source are transistors each having input, output and control electrodes, (b) a first bias resistor connected between said input and control electrodes of said input transistor and to said first voltage supply terminal, (c) a second bias resistor connected between said input electrode of said constant current source transistor and to said second voltage supply terminal, (d) an output load resistor connected between the output electrode of said output transistor and said first voltage supply terminal, (e) said input gate circuit means being poled opposite to the control and output electrodes of said input transistor to provide mutual offsetting temperature compensation, (f) said input and control electrodes of said constant current source transistor and said output transistor being oppositely poled to provide mutual offsetting temperature compensation between said constant current source transistor and said output transistor.

7. A variable threshold logic gate including in combination:

(a) an input transistor having input, output and control electrodes and connected to a first voltage supply terminal and normally biased to draw a very small current, (b) input diode gate circuit means connected to said input transistor and being poled opposite to the output and control electrodes of said input transistor thereby providing mutual offsetting temperature compensation between said gate circuit means and said input transistor, (c) a constant current source transistor having input, output and control electrodes, (d) an offset voltage dropping resistor connected between the output electrode of said input transistor and the input electrode of said current source transistor, (e) an output inverter transistor having input, output and control electrodes and connected to said offset resistor, and (f) said constant current source being connected to a second voltage supply terminal and to a variable bias network extending between said first and second voltage supply terminals for varying the current flow in said input transistor thereby varying the voltage drop across said offset voltage dropping resistor to change the threshold level at which said output invertor is driven into conduction.

8. The gate circuit according to claim 7 which further includes:

(a) a protection diode connected at one electrode thereof to a common junction between said output invertor transistor and said constant current source transistor and connected at the other electrode thereof to a point of reference potential for preventing said constant current source from saturating and for protecting said output invertor from voltage breakdown.

9. The gate circuit according to claim 8 which further includes:

(a) a second and third series connected output transistors connected between the output electrode of the first named output transistor invertor and a point of reference potential to provide a low impedance output between the second and third output transistors, and (b) a second current source transistor connected between said variable bias network and the first named current source transistor to compensate for the additional voltage drop added by the second and third output transistors.

10. The circuit according to claim 7 which further includes:

(a) a second input, output and constant current source transistor connected between said first and second voltage supplies and symmetrical with respect to and in an arrangement identical to said first named input, output and constant current source transistors, (b) a third and fourth input transistor connected in parallel with said first and second input transistors respectively, thereby adding additional capacity at the inputs of said gate, (c) cross coupling means connected between the respective outputs of said output transistors and the inputs of said third and fourth input transistors for providing bistable switching action, (d) means for applying AC set and reset signals to said first and second input transistors, and (e) means for applying DC set and reset signals to said third and fourth input transistors.

References Cited

UNITED STATES PATENTS

| | | | |
|---|---|---|---|
| 2,949,546 | 8/1960 | McVey | 307—235 |
| 3,083,303 | 3/1962 | Knowles et al. | 307—215 |
| 3,229,119 | 1/1966 | Bohn et al. | 307—215 X |
| 3,284,080 | 11/1966 | Jones | 307—215 X |

OTHER REFERENCES

Pressman, Transistorized Circuits for Digital Computers, March 1959, pp. 268, 270, 271.

ARTHUR GAUSS, *Primary Examiner.*

D. D. FORRER, *Assistant Examiner.*

U.S. Cl. X.R.

307—214, 218, 235, 237, 291, 296, 202, 297